(12) United States Patent
Kosinski

(10) Patent No.: US 7,397,165 B1
(45) Date of Patent: Jul. 8, 2008

(54) SURFACE WAVE RESONATOR WITH REDUCED ACCELERATION SENSITIVITY

(75) Inventor: John A. Kosinski, Neptune, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 11/729,085

(22) Filed: Mar. 27, 2007

(51) Int. Cl.
*H01L 41/00* (2006.01)

(52) U.S. Cl. .................... 310/313 R; 310/313; 310/344; 310/346; 310/348

(58) Field of Classification Search ............. 310/313 R, 310/313, 344, 346, 348
See application file for complete search history.

*Primary Examiner*—Darren Schuberg
*Assistant Examiner*—Bryan P Gordon
(74) *Attorney, Agent, or Firm*—Michael Zelenka; George B. Tereschuk

(57) ABSTRACT

A restrained surface wave resonator with reduced or abated acceleration sensitivity is provided with a stiffening layer, adhesive layers and subsurface horizontal indentations on the substrate to achieve reduced acceleration sensitivity, increased structural rigidity, decreased sensitivity to in-plane deformations, a lightweight device and reduced deleterious effects from environmental shocks and vibration. The substrate of the restrained surface wave resonators features multiple subsurface horizontal indentations in one major substrate surface deposited on a stiffening layer to provide improved structural rigidity against flexure caused by normal acceleration based upon the diminished mass and reduced weight resulting from removal of portions of the substrate subsurface through micro-machining, and it also tends to improve excessive sensitivity to other flexural deformations. The present invention encompasses a restrained surface wave resonator device and a restrained surface wave resonator system.

18 Claims, 1 Drawing Sheet

SURFACE WAVE RESONATOR WITH REDUCED ACCELERATION SENSITIVITY

GOVERNMENT INTEREST

The invention described herein may be manufactured, used and licensed by or for the Government of the United States of America without the payment by the Government of any royalties to me thereon.

FIELD OF THE INVENTION

The invention relates generally to piezoelectric devices, and in particular to surface acoustic wave crystal resonators.

BACKGROUND OF THE INVENTION

Piezoelectric resonators are well known in the art as electronic elements used to select and stabilize a particular frequency. Piezoelectric resonators are widely used in various kinds of civilian electronic equipment including mobile communication systems such as cellular, cordless, and satellite telephones, and military electronic equipment such as radars and weapons seekers. Piezoelectric resonators can also be used as sensors of temperature, pressure, force, acceleration, and mass. In all cases, the purpose of the resonator is to precisely determine the allowed frequency and to provide immunity against unwanted external environmental influences. The basic design of piezoelectric resonators is well known to those skilled in the art. The properties of the crystal resonator depend on the angles of cut as the piezoelectric crystal material is formed into a substrate, often in the form of a wafer. Metal electrodes are disposed upon the crystal wafer, which is mounted in a structure designed to hold the crystal wafer and to provide electrical contact to an external circuit. This crystal and holder assembly is called a piezoelectric resonator. Surface acoustic wave (SAW) resonators and shallow-bulk-acoustic-wave devices can be made to operate at frequencies from several MHz to well above 1 GHz.

The frequency of a piezoelectric resonator is affected by environmental stresses that deform the resonator, including vibration, shock, gravitational stress, temperature, aging, thermal hysteresis and so on. While these effects may be used as the basis for sensors, they are considered adverse effects in the case of a resonator. For example, even acceleration due to gravity produces measurable effects and the frequency of a piezoelectric resonator can shift significantly when turned upside down. In a specific example, when an oscillator using an ST-cut SAW resonator is turned upside down, the frequency typically shifts about $4 \times 10^{-9}$ due to the acceleration sensitivity of approximately $2 \times 10^{-9}$ $g^{-1}$. The sensitivity is the same when the crystal is subjected to vibration, i.e., the time-varying acceleration due to the vibration modulates the resonator frequency at the vibration frequency with a peak deviation of $\pm 2 \times 10^{-9}$ $g^{-1}$. In the frequency domain, the vibration sensitivity manifests itself as vibration-induced sidebands that appear at plus and minus the vibration frequency away from the carrier frequency.

The stresses caused by acceleration, vibration and shock are well-known to those skilled in the art. FIG. 1 illustrates a prior art piezoelectric surface wave resonator that suffers from inadequate structural rigidity and is therefore subject to excessive sensitivity arising from flexural deformations. The prior art piezoelectric surface wave resonator comprises a substrate 11 with electrodes 12A and 12B deposited on one of the major surfaces of substrate 11. The surface wave resonator may be a SAW employing a Rayleigh wave mode or a surface transverse wave (STW) resonator employing a shear-horizontal wave mode. The surface wave resonator is bonded to a circuit board 13 by an adhesive 14 that is applied uniformly over another major surface of substrate 11. The adhesive 14 may be a rigid adhesive such as an epoxy or a compliant adhesive such as RTV silicone. Electrodes 12A and 12B are coupled to circuit traces 15A and 15B with wire bonds 16A and 16B, respectively. The substrate 11 is a rectangular parallelepiped with a rectangular cross-section and rectangular plan-view.

Such prior art arrangements suffer from inherent disadvantages with respect to both normal, i.e. perpendicular to the major surfaces, and in-plane, i.e. in the plane of the major surfaces, acceleration sensitivities. Regarding the normal, or perpendicular, acceleration sensitivity, the prior art suffers from at least two distinct disadvantages. First, the simple rectangular shape of the device's cross-sectional and plan views does not permit optimal structural rigidity with respect to the flexural deformations of interest. Secondly, the application of adhesive over the full extent of a major surface, as well as the direct mounting of the resonator onto the circuit board provides little or no isolation from accelerations normal to the circuit board and flexural deformations of the circuit board. Concerning excessive in-plane acceleration sensitivity, the prior art arrangement has two somewhat similar disadvantages. The simple rectangular shape of the device's cross-sectional and plan views does not permit optimal structural rigidity to withstand the shear and anti-symmetric flexural deformations of interest. And, applying adhesive over the full extent of a major surface, as well as the direct mounting of the resonator onto the circuit board, provides little or no isolation from in-plane accelerations.

The two disadvantages of inadequate structural rigidity and lack of any degree of structural isolation contribute directly to excessively large acceleration sensitivity. This follows directly from the basic nature of acceleration sensitivity wherein the frequency shifts are directly proportional to the physical deformation of the crystal substrate. In turn, isolation from applied forces reduces the resulting deformation, as does an optimization of the structural rigidity of the resonator, both resulting in a lower acceleration sensitivity relative to a resonator lacking these features. Thus the inadequate structural rigidity and lack of structural isolation lead to deleterious effects on piezoelectric frequency stability, such as acceleration sensitivity and related effects including excessive aging due to mounting stress relief.

Thus, there has been a long-felt need to overcome the problems caused by the inadequate structural rigidity and excessive sensitivity to in-plane deformations in prior art surface wave piezoelectric resonators. A number of techniques have tried to resolve these long-standing difficulties with limited success, each obtaining some reduction in acceleration sensitivity at the price of increased size, weight, and so on. For example, one technique for eliminating or minimizing unwanted lack of rigidity and excessive sensitivity has been to introduce a simple, slab-like stiffener to the structure, but the use of such simple stiffeners has proven inadequate because of their enormous size relative to the crystal substrate; practical examples include 1 cm thick stiffeners applied to 0.35 mm thick resonators. Other alternative approaches to these long-standing problems, such as micromachined isolation systems have also shown initial promise, but they come at the cost of additional size, sophisticated fabrication and possibly additional electronics to drive an active cancellation system.

Until now, there are no currently available lightweight, simple, and low-cost piezoelectric restraint mechanisms and packaging techniques that satisfactorily strengthen and stiffen the surface wave piezoelectric resonator against the unwanted lack of adequate structural rigidity and excessive sensitivity to in-plane deformations. The present invention provides an innovative restraint technique that combines a stiffening layer, adhesive and horizontal slotted indentations in a surface wave resonator that has solved the sensitivity problems that have retarded advances in piezoelectric equipment, without suffering from the disadvantages shortcomings and limitations of prior art devices.

SUMMARY OF THE INVENTION

In order to satisfy the long-felt needs for practical lightweight and cost-efficient piezoelectric restraint techniques that advantageously restrain mechanical and structural resonances, the inventor has developed a surface wave resonator structure comprising a stiffening layer as a mounting support, adhesives and a group of subsurface horizontal slotted indentations that innovatively and successfully resolve the long-felt difficulties and shortcomings of inadequate structural rigidity and excessive sensitivity to externally applied forces and accelerations. The present invention solves the long-standing shortcomings, drawbacks and limitations of flexure caused by normal acceleration with the subsurface horizontal slotted indentations that serve to remove mass from the resonator structure. By removing mass from the resonator structure, the subsurface horizontal slotted indentations of the present invention provide a lightweight device that also reduces the body force that ordinarily drives flexural deformation. This invention's use of multiple subsurface horizontal indentations, together with the additional support provided by the stiffening layers and adhesive advantageously decreases unwanted flexural deformation to a level below that experienced by prior art devices, without suffering from the disadvantages, shortcomings and limitations of prior art devices.

Accordingly, it is an object of the present invention to provide a restrained surface wave resonator with reduced acceleration sensitivity which attacks all of the above problems and provides a complete restraint system that eliminates the known practical barriers to its full deployment.

It is another object of the present invention to provide a restrained surface wave resonator having a stiffening layer, adhesive and subsurface horizontal indentations to provide reduced acceleration sensitivity.

It is still another object of the present invention to provide a restrained surface wave resonator with multiple subsurface horizontal indentations in the substrate, stiffening layers and adhesive layers to provide increased structural rigidity, decreased sensitivity to in-plane deformations, a lightweight device and reduced deleterious effects from environmental shocks and vibration.

It is a further object of the present invention to provide a restrained surface wave resonator with multiple substrate subsurface horizontal indentations, stiffening layers and adhesive layers to provide increased structural rigidity, decreased sensitivity to in-plane deformations, a lightweight device and reduced deleterious effects from environmental shocks and vibration, without suffering from the disadvantages, shortcomings and limitations of prior art piezoelectric packaging arrangements.

These and other objects and advantages are provided by the restrained surface wave resonators of the present invention comprising a substrate with multiple subsurface horizontal indentations in one major substrate surface deposited on a stiffening layer, a circuit board and multiple adhesive layers. The substrate with its multiple subsurface horizontal slotted indentations provides improved structural rigidity against flexure caused by normal acceleration based upon the diminished mass and reduced weight resulting from removal of portions of the substrate subsurface through micro-machining, and it also tends to improve excessive sensitivity to other flexural deformations, without suffering from the disadvantages, shortcomings and limitations of prior art packaging arrangements. The present invention encompasses a restrained surface wave resonator device and a restrained surface wave resonator system.

DETAILED DESCRIPTION OF THE DRAWINGS

The various embodiments of the restrained surface wave resonator devices, structures and systems of the present invention comprise depositing a metallization layer, a substrate and a stiffening layer on a circuit board, with the substrate having multiple subsurface horizontal slotted indentations in one of its major surfaces, along with several layers of adhesive for added rigidity. In accordance with the present invention, the substrate, its multiple subsurface horizontal indentations, the stiffening and adhesive layers provide significantly improved structural rigidity against flexure caused by normal acceleration, and a substantial decrease in excessive sensitivity to other flexural deformations by advantageously removing mass from the substrate, thereby reducing the mass, weight and the body forces that typically drive flexural deformations.

Figure 2:
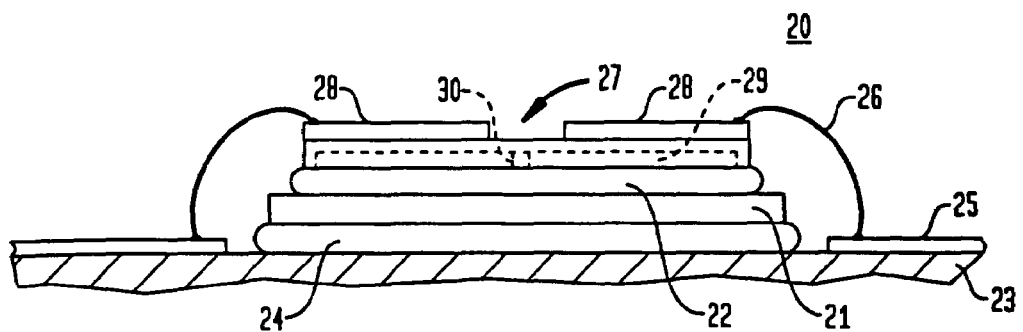
FIG. 2 depicts a cross-sectional view of the restrained surface wave resonator device of the present invention.

Referring now to the drawings, FIG. 2 depicts one embodiment of the restrained surface wave resonator system 20 of the present invention. The restrained surface wave resonator system with abated acceleration sensitivity 20 comprises depositing metallization layers 28 on a first major surface of a substrate 27. A first adhesive layer 22 fastens the substrate 27 to a stiffening layer 21. The stiffening layer 21 is attached to a circuit board 23 with a second adhesive layer 24. The electrode metallization layers 28 are connected to a circuit trace 25 with a pair of wire bonds 26. The substrate 27 has multiple subsurface horizontal indentations 29 etched or micro-machined into the second major substrate surface. The subsurface horizontal indentations 29 are separated by structural support members 30 which provide additional structural stability to the substrate 27, reduced mass and a lighter weight resonator system 20. The structural support members 30 can be seen in more detail in FIG. 3.

Figure 1:
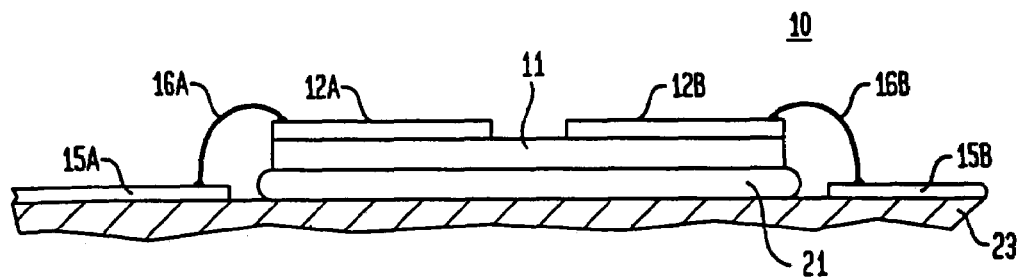
FIG. 1 is a cross-sectional view of a prior art resonator package.

The second major surface of substrate 27 includes multiple subsurface horizontal indentations 29, which are micro-machined slots, or voids, that remove portions of the substrate material from substrate 27. By micro-machining a major surface of substrate 27, the multiple subsurface horizontal slotted indentations 29 allow for improved structural rigidity and prevent or substantially diminish flexure caused by normal acceleration due to the removal of mass and reduced weight by virtue of the indentations 29. Structural members 30 retain essentially the same structural stiffness of the un-machined regions of the major surface, while the reduction in mass and weight resulting from the micro-machining reduces the body force driving flexural deformation. Thus, the tendency of substrate 27 toward flexural deformation is greatly reduced as compared to the FIG. 1 prior art arrangement. Micro-machining one major surface of substrate 27 allows for improved structural rigidity with respect to flexure and shear that are caused by in-plane acceleration in a similar fashion to the improved structural rigidity achieved with respect to the unwanted normal accelerations. The micro-machining of one major surface of substrate 27 can be accomplished by any number of techniques known to those skilled in the art, including wet and dry etching and micromachining techniques.

In operation, the first and second adhesive layers 22 and 24 cooperate with the stiffening layer 21 to further isolate substrate 27 from flexural deformations of circuit board 23. This occurs through a proper selection of the material properties of the stiffener and adhesives. The stiffening layer 21 needs to be composed of a material that is substantially more rigid than the circuit board 23. The stiffener 21 will typically be more rigid than the substrate 27 but this is not a requirement and there are advantages to using a crystal substrate structure that is more rigid than the stiffener. One preferred material for the stiffening layer 21 is alumina ceramic. The stiffening layer 21 should be formed from a lightweight structure with its own slotted indentations and structural elements similar to those of substrate 27. The multiple subsurface horizontal indentations 29 in the second major surface of substrate 27 serve to reduce the contact area between substrate 27 and the first adhesive layer 22. The reduced adhesive contact area increases the force per unit area transferred to the first adhesive layer 22 in the contact area, which causes an increased relative deformation of the first adhesive layer 22, and enhanced isolation of the substrate 27. The same effect should also occur for an appropriately-shaped stiffening layer 21 and second adhesive layer 24. These components work together to reduce the deformation of the crystal substrate as follows: when subjected to an acceleration normal to the plane of the crystal plate, the circuit board 23, stiffener 21, crystal substrate 27, and adhesive layers 22 and 24 experience body forces proportional to their masses. These forces are minimized by minimization of their masses through micromachining. The circuit board 23 will flex, but the stiffener 21 will flex less since it is both stiffer and attached using soft adhesive layers 22 and 24. The crystal resonator 20 can be further isolated from the flexure of the stiffener by using a soft adhesive.

Figure 3:
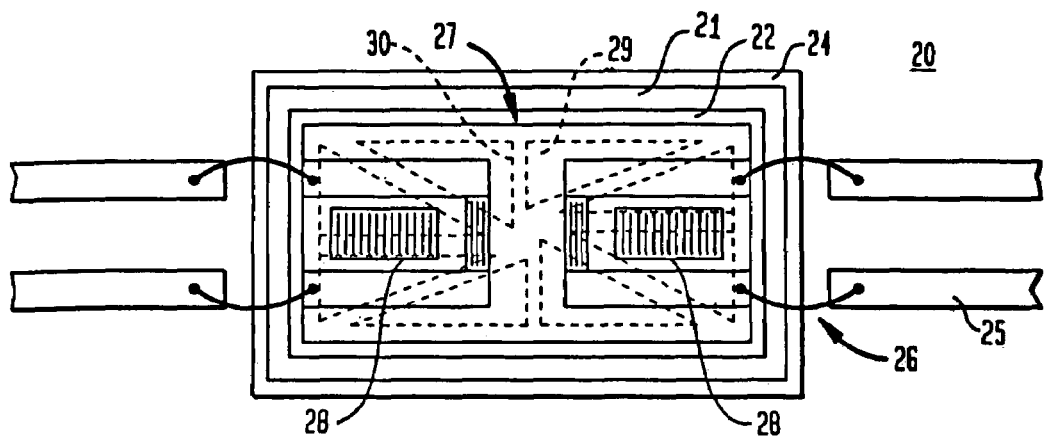
FIG. 3 depicts a plan-view of the restrained surface wave resonator device of the present invention.

FIG. 3 is a top plan-view of the restrained surface wave resonator system 20 of the present invention. Metallization layers 28 are located on the first major surface of substrate 27. Substrate 27 is shown in break-away fashion with triangular broken line structures 29 representing the multiple subsurface horizontal slotted indentations 29 etched or micro-machined into the substrate 27 subsurface. The subsurface horizontal indentations 29 are separated by several structural support members 30 to provide additional structural stability to the substrate 27.

A number of variations to the restrained surface wave resonator system 20 of the present invention. For example, the subsurface horizontal slotted indentations 29 can either be etched or micro-machined into one of the major surfaces of the substrate. Or a suitable restrained surface wave resonator could be mounted inside a hermetically sealed package, which, in turn, is mounted on the circuit board instead of having the resonator and other layers mounted directly on the circuit board. Other variations include alternative choices in the relative stiffnesses of the various layers in order to minimize the deformation of the crystal substrate. These selections will involve trade-offs in material stiffness and structural design against size and mass. For example, it may be possible to fabricate a crystal substrate structure with greater rigidity than that of the stiffener, in which case soft adhesive should be used, whereas in another choice where the crystal substrate is made thinner and thus less rigid than the stiffener, a relatively more rigid adhesive should be used.

These embodiments of the present invention are intended to be illustrative and not limiting with respect to the variety of possible embodiments. It is to be further understood that other features and modifications to the foregoing detailed description of the restrained surface wave resonator devices and methods and are all considered to be within the contemplation of the present invention, which is not limited by this detailed description. Those skilled in the art will readily appreciate that any number of configurations of the present invention and numerous modifications and combinations of materials, components, geometrical arrangements and dimensions can achieve the results described herein, without departing from the spirit and scope of this invention. Accordingly, the present invention should not be limited by the foregoing description, but only by the appended claims.

What I claim is:

1. A restrained surface wave resonator device with abated acceleration sensitivity, comprising:

a plurality of metallization layers are stacked on a first major surface of a substrate;

a first adhesive layer fastens said substrate to a stiffening layer;

said stiffening layer is attached to a circuit board by a second adhesive, said stiffening layer being composed of a material substantially more rigid than said substrate and said circuit board;

said substrate having a second major surface with a plurality of horizontal subsurface slotted indentations, said plurality of slotted indentations removing a portion of substrate material from said second surface;

each of said plurality of slotted indentations being separated by a plurality of structural support members;

said resonator, having a plurality of performance characteristics, when placed in motion, is subjected to a plurality of degrading acceleration sensitivity effects;

said plurality of degrading acceleration effects further comprising a normal acceleration, an in-plane acceleration and a plurality of flexural deformations;

said first adhesive layer and said second adhesive layer cooperate with said stiffening layer to isolate said substrate from said plurality of degrading acceleration sensitivity effects; and said plurality of slotted indentations provide an improved structural rigidity to abate said plurality of degrading acceleration sensitivity effects and maintain said plurality of resonator performance characteristics.

2. The restrained surface wave resonator device with abated acceleration sensitivity, as recited in claim 1, further comprising:

said plurality of metallization layers being a pair of metallization layers;

said pair of metallization layers being connected to a circuit trace with a pair of wire bonds.

3. The restrained surface wave resonator device with abated acceleration sensitivity, as recited in claim 2, further comprising said stiffening layer being composed of a lightweight material.

4. The restrained surface wave resonator device with abated acceleration sensitivity, as recited in claim 3, further comprising said stiffening layer being composed of alumina ceramic.

5. The restrained surface wave resonator device with abated acceleration sensitivity, as recited in claim 3, further comprising said slotted indentations being micro-machined into said second major surface.

6. The restrained surface wave resonator device with abated acceleration sensitivity, as recited in claim 3, further comprising said slotted indentations being etched into said second major surface.

7. The restrained surface wave resonator device with abated acceleration sensitivity, as recited in claim 3, further comprising:
   said plurality of slotted indentations result in a reduced adhesive contact area between said substrate and said first adhesive layer;
   said reduced adhesive contact area increases a force per unit area transferred to said first adhesive layer; and
   said force per unit area transferred causes an increased relative deformation of said first adhesive layer an enhanced isolation of said substrate from said plurality of degrading acceleration sensitivity effects.

8. The restrained surface wave resonator device with abated acceleration sensitivity, as recited in claim 3, further comprising said stiffening layer having a plurality of stiffener horizontal slotted indentations separated by a plurality of stiffener structural support members.

9. The restrained surface wave resonator device with abated acceleration sensitivity, as recited in claim 3, further comprising said resonator being mounted inside a hermetically sealed package.

10. A restrained surface wave resonator system with abated acceleration sensitivity, comprising:
    a pair of metallization layers are stacked on a first major surface of a substrate;
    a first adhesive layer fastens said substrate to a stiffening layer;
    said stiffening layer is attached to a circuit board by a second adhesive, said stiffening layer being composed of a material substantially more rigid than said substrate and said circuit board;
    said substrate having a second major surface with a plurality of horizontal subsurface slotted indentations, said plurality of slotted indentations removing a portion of substrate material from said second surface;
    each of said plurality of slotted indentations being separated by a plurality of structural support members;
    said resonator having a plurality of performance characteristics;
    said resonator, when placed in motion, being ordinarily subjected to a plurality of degrading acceleration sensitivity effects;
    said plurality of degrading acceleration effects further comprising a normal acceleration, an in-plane acceleration and a plurality of flexural deformations;
    said first adhesive layer and said second adhesive layer cooperate with said stiffening layer to isolate said substrate from said plurality of degrading acceleration sensitivity effects; and
    said plurality of slotted indentations provide an improved structural rigidity to abate said plurality of degrading acceleration sensitivity effects and maintain said plurality of resonator performance characteristics.

11. The restrained surface wave resonator system with abated acceleration sensitivity, as recited in claim 10, further comprising:
    said plurality of metallization layers being a pair of metallization layers;
    said pair of metallization layers being connected to a circuit trace with a pair of wire bonds.

12. The restrained surface wave resonator system with abated acceleration sensitivity, as recited in claim 11, further comprising said stiffening layer being composed of a lightweight material.

13. The restrained surface wave resonator system with abated acceleration sensitivity, as recited in claim 12, further comprising said stiffening layer being composed of alumina ceramic.

14. The restrained surface wave resonator system with abated acceleration sensitivity, as recited in claim 13, further comprising:
    said plurality of slotted indentations result in a reduced adhesive contact area between said substrate and said first adhesive layer;
    said reduced adhesive contact area increases a force per unit area transferred to said first adhesive layer; and
    said force per unit area transferred causes an increased relative deformation of said first adhesive layer an enhanced isolation of said substrate from said plurality of degrading acceleration sensitivity effects.

15. The restrained surface wave resonator system with abated acceleration sensitivity, as recited in claim 14, further comprising said stiffening layer having a plurality of stiffener horizontal slotted indentations separated by a plurality of stiffener structural support members.

16. The restrained surface wave resonator system with abated acceleration sensitivity, as recited in claim 15, further comprising said resonator being mounted inside a hermetically sealed package.

17. The restrained surface wave resonator system with abated acceleration sensitivity, as recited in claim 16, further comprising said slotted indentations being micro-machined into said second major surface.

18. The restrained surface wave resonator system with abated acceleration sensitivity, as recited in claim 16, further comprising said slotted indentations being etched into said second major surface.

* * * * *